United States Patent [19]

Gonzales

[11] Patent Number: 4,477,862
[45] Date of Patent: Oct. 16, 1984

[54] BACKPLANE CONNECTOR

[75] Inventor: Roman Y. Gonzales, Andover, Mass.

[73] Assignee: Gould Inc., Rolling Meadows, Ill.

[21] Appl. No.: 379,644

[22] Filed: May 19, 1982

[51] Int. Cl.³ .............................................. H05K 7/10
[52] U.S. Cl. .................................. 361/393; 361/380; 361/413; 339/17 LM
[58] Field of Search ....... 339/17 LM, 17 M, 176 MP, 339/176 M; 361/331, 380, 390–396, 399, 413, 415, 417, 419, 420, 425, 426, 412

[56] References Cited

U.S. PATENT DOCUMENTS

| | | | |
|---|---|---|---|
| 2,904,768 | 9/1959 | Rasmussen | 339/17 LM |
| 2,929,965 | 3/1960 | Oden | 339/17 LM |
| 3,942,077 | 3/1976 | Powers | 361/331 |
| 4,008,942 | 2/1977 | Grossi | 339/17 M |
| 4,226,491 | 10/1980 | Kazama | 361/399 |
| 4,247,882 | 1/1981 | Prager | 361/380 |
| 4,334,261 | 6/1982 | Gonzales | 361/415 |

Primary Examiner—G. P. Tolin
Attorney, Agent, or Firm—Mattern, Ware, Stoltz & Fressola

[57] ABSTRACT

By providing a multi-faced connector having a female contact receiving portion formed on a first face, a male contact connecting portion formed on a second face thereof, opposite said first face, and printed circuit board receiving contacts formed on a third face thereof, a unique backplane connector is achieved which is capable of mating electronic engagement with adjacent connectors while also being capable of receipt and transmission of electronic signals from and to the printed circuit boards connected therewith. In the preferred embodiment, the backplane connector of the present invention is removably mountable in a support channel which is capable of receiving and supportingly maintaining input/output modules electronically engaged with the backplane connector.

12 Claims, 6 Drawing Figures

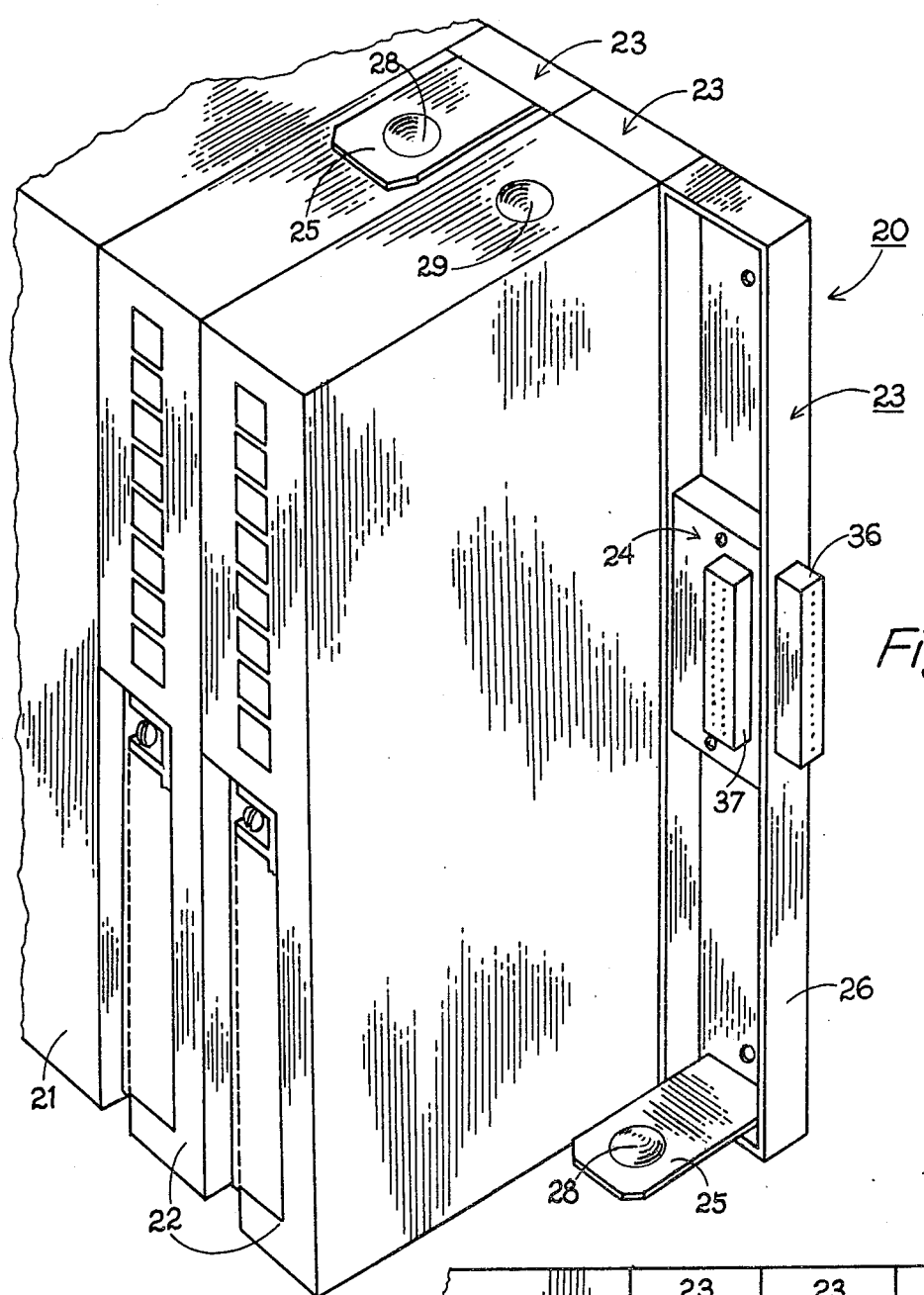
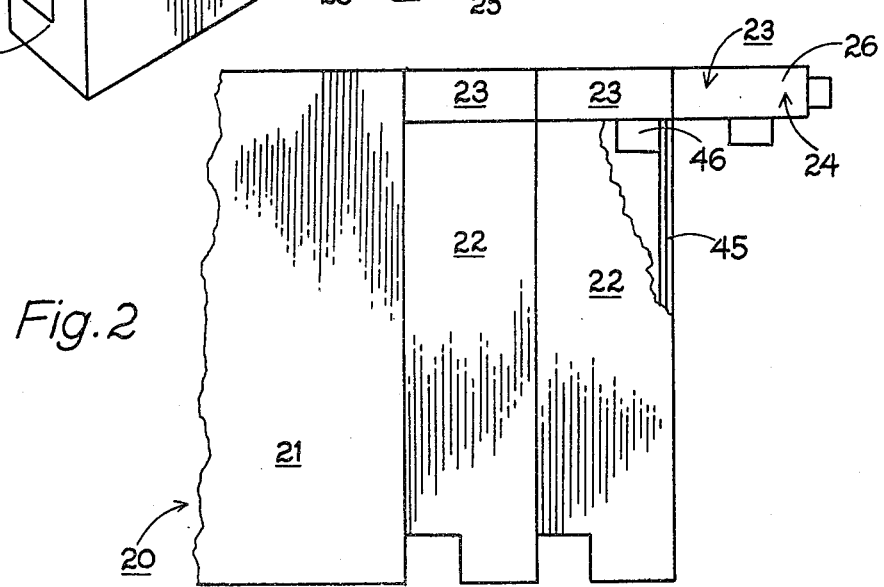
Fig.1
Fig.2

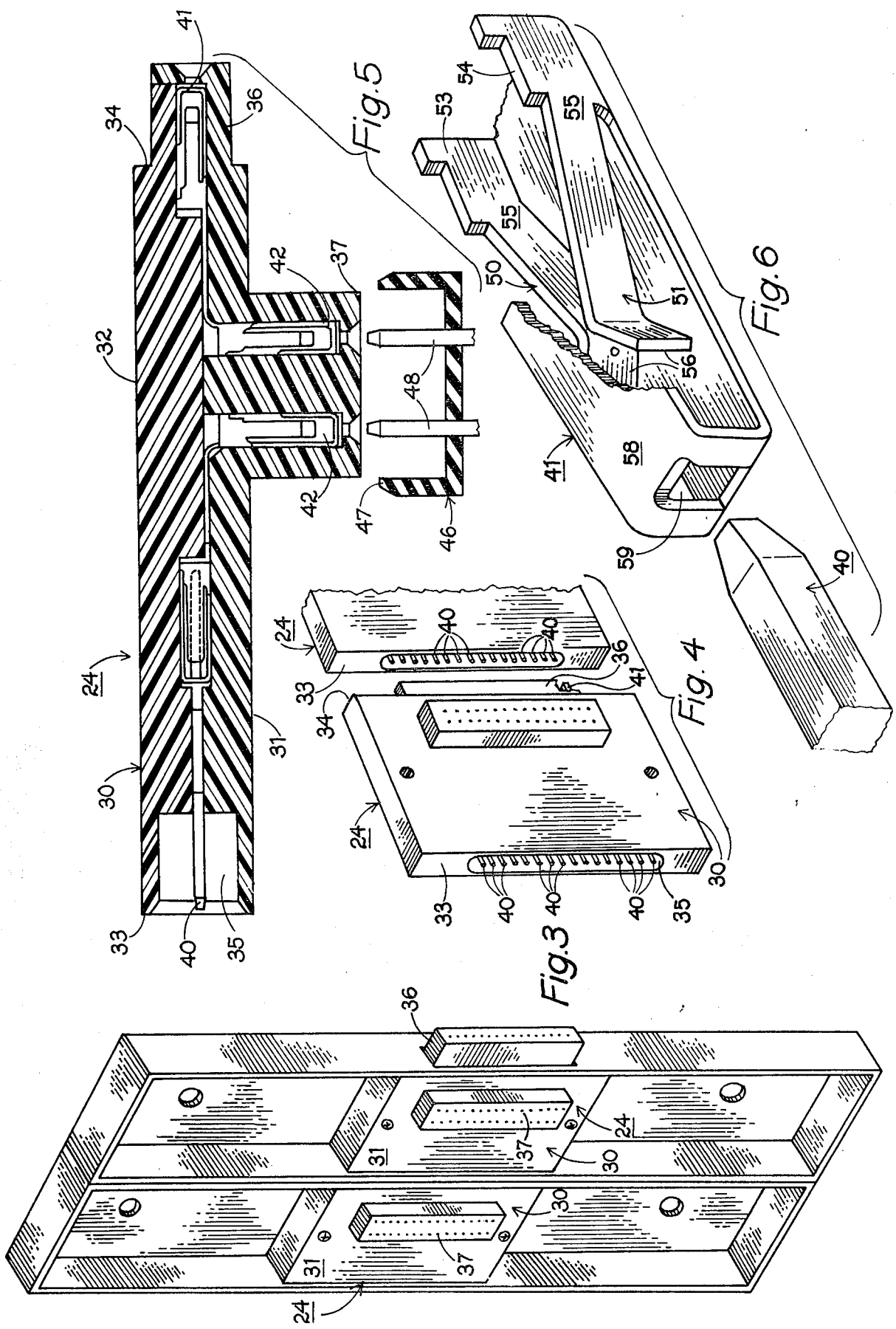

BACKPLANE CONNECTOR

TECHNICAL FIELD

This invention relates to a connector for use with programmable controllers and more specifically to a backplane connector constructed for receipt of input or output modules as well as electrical interconnections with adjacent backplane connectors.

BACKGROUND ART

In the general construction and operation of programmable controllers, a plurality of input modules and output modules are electronically connected to a central processing unit. In order to achieve this electronic connection, each input/output module electronically contacts a backplane printed circuit board through a conventional contact member. Typically, the printed circuit board incorporated within the input/output module incorporates a plurality of edge contacts which matingly engage with an edge contact receiving member in order to electronically connect the input/output module to the backplane printed circuit board. One such typical construction can best be seen in U.S. Pat. No. 3,942,077 issued to Howard A. Powers. Similar backplane connectors mounted to backplane printed circuit boards for electronically connecting input/output modules or input/output printed circuit boards to the central processing unit of the programmable controller are also shown in U.S. Pat. No. 4,247,882 of Prager et al and U.S. Pat. No. 4,215,386 of Prager et al.

Although these prior art systems effectively and efficiently achieve the desired interconnection of the input/output modules to the central processing unit, their inherent structural and manufacturing complexity prevents these backplane contact assemblies from being capable of use in an inexpensive programmable controller. In addition, these prior art backplane contact assemblies are generally structured for a specific number of input/output modules, leaving void areas in situations where users require less than the maximum number of modules which the system is capable of handling. Furthermore, since a fixed printed circuit board is incorporated into these prior art backplane contact assemblies, they are incapable of being physically separated from the system when a reduced number of input/output modules are required.

Therefore, it is the principal object of the present invention to provide a backplane connector capable of being electronically connected to adjacent connectors while also being electronically interconnected with input/output printed circuit boards, without requiring any separate backplane printed circuit board as part of the backplane assembly.

Another object of the present invention is to provide a backplane connector having the characteristic features described above which is mountable to accomodate only the desired number of modules associated with this system.

Another object of the present invention is to provide a backplane connector having the characteristic features described above which is removably mountable in a support member which also supportingly retains the modules in position.

Another object of the present invention is to provide a backplane connector having the characteristic features described above which is inexpensive to manufacture and capable of quick and easy assembly.

Other and more specific objects will in part be obvious and will in part appear hereinafter.

SUMMARY OF THE INVENTION

The present invention overcomes these prior art drawbacks by providing a unique backplane connector which is capable of mating engagement with similar adjacent backplane connectors while also being interconnectable with an input module or an output module. Preferably, these backplane connectors matingly engage with each other either horizontally or vertically in order to provide a convenient array of modules which can be easily mounted to a wall or in an appropriately sized cabinet.

In the preferred embodiment, each backplane connector incorporates a male contact connecting portion along one surface thereof and a female contact receiving portion on a second surface which is diametrically opposed to the first surface. In this way, the backplane connectors are capable of quick and easy interconnection to form an expandable, substantially continuous horizontal or vertical array.

In addition, each backplane connector also incorporates an input/output module receiving contact formed on a third face thereof which is positioned for mating receipt and interconnected engagement of either an input module or an output module. In this way, a plurality of input/output modules are each individually connectable to one of the plurality of backplane connectors with each backplane connector electronically interengaged for transmission of the requisite signals to a central processing unit. Once the desired external devices are connected to the input/output modules, the system is ready for providing the desired controlled performance.

The use of the present invention assures rapid installation as well as quick and easy expandability of the system in accordance with the needs of the user.

The invention accordingly comprises an article of manufacture possessing the features, properties, and the relation of elements which will be exemplified in the article hereinafter described, and the scope of the invention will be indicated in the claims.

BRIEF DESCRIPTION OF THE DRAWINGS

For a fuller understanding of the nature and objects of the invention, reference should be had to the following detailed description taken in connection with the accompanying drawings, in which:

FIG. 1 is a perspective view of an assembled programmable controller incorporating the backplane connector of the present invention, with one of the input/output modules removed with the backplane connector of the present invention shown mounted in place;

FIG. 2 is a top plan view of the programmable controller assembly of FIG. 1;

FIG. 3 is a perspective view showing two backplane connector members of the present invention mounted in position in a supporting channel and interconnected with each other;

FIG. 4 is a perspective view, partially broken away, of two backplane connector members shown in their disengaged positions;

FIG. 5 is a greatly enlarged horizontal cross sectional view of a backplane connector of the present invention; and FIG. 6 is a greatly enlarged perspective view of the mating connectors employed in the backplane connector of the present invention.

BEST MODE FOR CARRYING OUT THE INVENTION

In FIGS. 1 and 2, a partially assembled programmable controller 20 is shown which incorporates a central processing unit 21, two input/output modules 22, and three backplane connector assemblies 23. Each backplane connector assembly 23 incorporates a backplane connector member 24, module supporting tongues 25 and an elongated channel 26 within which both connector member 24 and tongues 25 are securely mounted.

In the preferred embodiment, each backplane connector assembly 23 incorporates two supporting tongues 25, with one tongue positioned at the top of channel 26 and the other at the base of channel 26 to securely support both the top and bottom of the module mounted thereto. In addition, each tongue 25 preferably incorporates a locking protrusion 28 which matingly engages with a recess 29 formed in module 22 to securely lock module 22 in position.

Although the backplane connector of the present invention is shown in conjunction with central processing unit 21 and input/output modules 22, establishing programmable controller 20, it is readily apparent that the backplane connector of the present invention can be employed in a plurality of similar, alternative systems wherein the inherent features and structural advantages provided by the backplane connector of the present invention are advantageous. Consequently, it is to be understood that the description of the backplane connector of the present invention with input/output modules 22 in a programmable controller 20 is made and referred to herein for illustrative purposes only, and should not be considered to limit the scope of the present invention.

Each backplane connector assembly 23 is matingly engaged with an adjacent backplane connector assembly 23 to provide a plurality of adjacent interconnected input/output module receiving members. In addition, input/output modules 22 are shown in mated electronic engagement with two of the three backplane connector assemblies 23. As is more fully described below, each input/output module 22 incorporates a printed circuit board 45 and a connector 46 mounted along the rear edge of PC board 45. Consequently, in order to electronically engage input/output module 22 with backplane connector assembly 23, input/output module 22 is merely placed on supporting tongues 25 and moved rearwarly, until rear connector 46 of input/output module 22 electronically engages with module connector portion 37 of backplane connector member 24.

As best seen in FIGS. 3, 4, and 5, each individual backplane connector 24 incorporates a base member 30 having a front surface 31, a rear surface 32, and side surfaces 33 and 34. Side surface 33 incorporates an elongated groove 35 formed in a portion thereof, while side surface 34 incorporates tongue portion 36 extending outwardly from side surface 34 and dimensioned for sliding interconnected engagement with groove 35 of side surface 33.

In order to provide the electrical connection between adjacent backplane connectors 24 when connectors 24 are interengaged, a plurality of contact pins 40 are mounted within groove 35 of side surface 33. In addition, a plurality of pin receiving contacts 41 are contained within tongue 36 which extends from side surface 34 of backplane connector 24.

In this way, the interengaged insertion of tongue 36 within groove 35 simultaneously produces the electrical interconnection of the plurality of pins 40 within the plurality of aligned pin receiving contacts 41. Consequently, when an individual backplane connector 24 is inserted into engagement with an adjacent backplane connector 24, the interengagement between connectors 24, 24 automatically produces electrical conductivity therebetween.

As mentioned above, module connection portion 37 is formed on front face 31 of backplane connector 24, extending forwardly therefrom. As best seen in FIG. 5, module connector 37 contains a plurality of pin receiving contacts 42 which are aligned for mating interconnected receipt of cooperating pins mounted to the rear of input/output module 22. In this way, input/output module 22 is electronically engaged with backplane connector 24 by merely being positioned with its connecting pins matingly interengaged with pin receiving members 42 of module connector portion 37 of backplane connector 24.

As shown in FIG. 2, each input/output module 22 contains a printed circuit board 45 and a rear connector 46 electronically mounted thereto. As detailed in FIG. 5, connector 46 contains a housing 47 and a plurality of contact pins 48 peripherally surrounded and contained within housing 47. Pins 48 of connector 46 of input/output module 22 are aligned for insertion and interconnected engagement with pin receiving contacts 42 of module connector portion 37 of backplane connector 24.

Since pins 48 and pin receiving contacts 42 are all pre-positioned for aligned interconnected engagement with each other, input/output module 22 is quickly and easily electronically engaged with backplane connector 24 by merely positioning input/output module 22 with housing 47 peripherally surrounding module connector portion 37 of backplane connector 24, causing pins 48 to be inserted into pin receiving contacts 42 of module connector 37, producing the desired electronic interengagement therebetween.

As can be readily seen from the foregoing detailed description of the construction and interconnected engagement of backplane connectors 24 and input/output modules 22, it is readily apparent that backplane connector 24 of the present invention assures and provides installation ease and maintenance free difficulty of backplane connections as well as the addition of input/output modules. By employing backplane connector 24 of the present invention, a central processing unit 21 can be quickly and easily expanded to accomodate any number of input/output modules 22 by merely adding backplane connectors 24 and its associated housing 23 to the existing module construction.

When any additional module is required, a backplane connector 24 is positioned within its associated channel 26 with tongues 25 positioned for retained engagement of the module, and the entire backplane connector assembly 23 is simply mounted in electronic engagement with the extending tongue 36 of the adjacent backplane connector 24, electronically engaging the pins 40 with the groove 35 of the new backplane connector with the contacts 41 within tongue 36. With connector 24 mounted in place and channel 26 secured in position, the desired input/output module 22 is merely placed on support tongues 25 and moved rearwardly until rear connector 46 of the input/output module 22 is in mated electronic engagement with module connect portion 37 of backplane connector 24, and protrusion 28 of tongues 25 are in nested, locked engagement within recesses 29 of module 22. With these simple, easily executed steps, a new input/output module is quickly and easily added to an existing system, ready for interconnected engagement with the associated hardware and controlled operation of the systems connected thereto.

Although the preferred embodiment of the present invention employed backplane connector 24 with support channel 26, backplane connector 24 can be employed separately or with any other type of support system. In particular, in applications where input/output modules 22 are separately supported, such as in self-contained cabinets or on racks, backplane connector 24 may be employed by itself by merely mounting the backplane connector 24 to an existing backplane connector and then sliding input/output module 22 into the cabinet and into electronic engagement with the newly added backplane connector 24.

Since backplane connectors 24 of this invention are lightweight and directly matingly interconnect with each other as well as with input/output modules 22, the mating engagement of backplane connector 24 with module 22 and adjacent connector 24 is sufficient to supportingly maintain backplane connector 24 in position. Consequently in such arrangement, no further support means is required.

In FIG. 6, the preferred construction for contact pin 40 and pin receiving member 41 can best be seen. Pin 40 preferably comprises a single elongated post member with the distal end thereof incorporating bevelled surfaces in order to facilitate the insertion of pin 40 into pin receiving member 41.

Pin receiving member 41 preferably comprises flexible arm members 50 and 51 which are positioned in juxtaposed cooperating relationship for receipt and electrical interconnected engagement with contact pin 40. In the preferred construction, flexible arms 50 and 51 comprise elongated substantially flat spring members which are rigidly mounted at their proximal end.

As shown in FIG. 6, flexible arm 50 extends from supporting flange 53, while flexible arm 51 extends from supporting flange 54. In addition, the flexible arms 50 and 51 each comprise a substantially L-shape formed by sections 55 and 56.

Flexible arms 50 and 51 extend from their respective proximal ends, securely mounted to their respective flanges 53 and 54 with elongated sections 55, 55 thereof extending towards each other, while the short terminating sections 56, 56 extending away from each other. In this way, terminating sections 56, 56 establish an open, pin receiving zone therebetween into which pins 40 can easily slide and contact flexible arms 50 and 51, causing the arms to spread apart from each other while assuring secure electrical contact with pin 40.

In addition, the preferred structure of pin receiving member 41 also incorporates substantially flat plate 58 which partially surrounds flexible arms 50 and 51. In addition, partially surrounding plate 58 incorporates a portal 59 which is in juxtaposed spaced cooperating relationship with terminating end sections 56, 56 of flexible arms 50 and 51 to provide a pin receiving and guiding portal. This construction assures the sliding interconnected engagement of pin 40 with connector 41.

In the preferred construction, plate 58 peripherally surrounds the upper and lower edges of flexible arms 50 and 51 with a substantially continuous U-shaped plate structure. With this construction, the entire contact member 41 can be manufactured from a single flat plate which is stamped and folded to the desired configuration. In this way, an inexpensive, but efficient connect member is achieved which assures positive secure interconnected electrical engagement in a repeatable and reliable manner.

It will thus be seen that the objects set forth above, among those made apparent from the preceding description, are efficiently attained and, since certain changes may be made in the above article without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A backplane connecting system comprising a plurality of identically constructed backplane connector units, each being in electronic interengagement with adjacent connector units and mating electronic engagement with electronic modules mounted therewith, each of said backplane connector units comprising A. a single independent, self-supporting, unitary structure incorporating
   a. two side surfaces, and
   b. a module receiving surface interposed between said two side surfaces;
B. a tongue portion
   a. extending outwardly from one of said side surfaces, and
   b. incorporating a first set of contact means arrayed therein;
C. a groove portion
   a. formed in the second of said side surfaces,
   b. each groove portion receiving therewithin the tongue portion of an identically constructed separate, adjacent backplane connector unit, and
   c. incorporating a second set of contact means arrayed therein and in cooperative, positive, removable contact, with the first set of contact means in the tongue portion of the identically constructed, separate, adjacent backplane connector unit; and
D. module receiving contacts mounted to said module receiving surface and positioned for mating electronic interengagement with a module to be mounted thereto, whereby a backplane connecting system is achieved which a plurality of identical independent, self-supporting backplane connectors directly, matingly electronically interengage with each other in an easily achieved "plug and socket" manner, while also being capable of electronic interengagement with a plurality of modules mounted to a particular connector for carrying the desired electronic signals between the module and its associated controlled equipment.

2. The backplane connector system defined in claim 1, comprising a regular parallelepiped shape and said side surfaces are formed on opposite, parallel surfaces thereof.

3. The backplane connector system defined in claim 2, wherein said system further comprises a module receiving connector mounted to a substantially flat front surface of each said backplane connector unit, extending therefrom and incorporating said module receiving contacts for mating electronic interengagement with the contacts of the module.

4. The backplane connecting system defined in claim 1, wherein the tongue portion of a first backplane connector unit and the groove portion of a second backplane connector unit are dimensioned for cooperative sliding interengagement of the tongue portion within the groove portion.

5. The backplane connector system defined in claim 4, wherein the second set of contact means arrayed within the groove portion is further defined as comprising a plurality of independent pin members arrayed within said groove portion in a single row substantially parallel to each other.

6. The backplane connector system defined in claim 5, wherein said first set of contact means arrayed within each tongue portion is further defined as comprising a plurality of each independent pin receiving means, each incorporating a pair of arm members attached at their proximal end to independent support means, and said arm members flexibly extending from their proximal supported position angularly towards each other, with their distal ends in juxtaposed cooperating relationship with each other for flexible mating receipt and electronic engagement with the pin member.

7. The backplane connector system defined in claim 6, wherein each of said flexible arm members of the pin receiving means is further defined as comprising an L-shape with the longer portion thereof incorporating the proximally mounted end and the short portion of each flexible arm thereof positioned in diverging cooperating relationship with the other of said pair of arm members, thereby providing a substantially V-shape entry zone for guiding the pin member inserted therebetween and assuring electrical interengagement of the pin member with said flexible arms.

8. The backplane connector system defined in claim 6, wherein said first set of contact means further comprises pin receiving entry portals positioned forward of said flexible arm members in juxtaposed cooperating spaced relationship therewith, thereby guidingly aligning the post member for electronic engagement with the flexible arms.

9. An expandable, multi-purpose input/output system interconnected with a central processor to form a machine controller interconnected with an operating external device, comprising A. a plurality of electronic modules each incorporating
   a. a plurality of connection means for electronic engagement with external devices, and
   b. contact means mounted at the rear of each of said modules for electronic interengagement with a backplane connector unit; and B. a plurality of identically constructed backplane connector units each of which are directly electronically interengaged with adjacent backplane connector units to form a substantially continuous elongated array of directly interconnected backplane connector units, with the first connector unit thereof electronically engaged with the central processor, each of said backplane connector units comprising
   a. a single, independent, self-supporting, unitary structure formed in a substantially regular parallelepiped shape,
   b. a tongue portion
      1. extending outwardly from one side surface thereof, and
      2. incorporating a first set of contact means arrayed therein,
   c. a groove portion
      1. formed in a second side surface of said backplane connector unit, parallel to the first side surface,
      2. in direct receiving interengagement with the tongue portion of a separate, adjacent backplane connector unit, and
      3. incorporating a second set of contact means arrayed therein which is in directly contacting, electronic interengagement with the first set of contact means in the tongue portion of the separate, adjacent backplane connector unit, and
   d. module receiving contacts mounted to the front surface of said backplane connector unit in mating electronic engagement with the rear contact means of the module, whereby the plurality of electronic modules are quickly and easily directly, matingly electrically connected between said external devices and said central processor by merely being inserted and electrically connected to one of said plurality of backplane connector units, thereby providing a readily expandable, multi-purpose input/output system wherein complete electrical interconnection of the external equipment through the electronic module to the central processor is made quickly and easily, while also assuring system expandability by merely adding additional backplane connector units and associated electronic modules.

10. An expandable, multi-purpose input/output system interconnected with a central processor to form a machine controller interconnected with an operating external device, comprising A. a plurality of electronic modules each incorporating
   a. a plurality of connection means for electronic engagement with external devices, and
   b. contact means mounted at the rear of each of said module for electronic interengagement with a backplane connector unit; and B. a plurality of backplane connector units each of which are directly electronically interengaged with adjacent backplane connector units to form a substantially continuous elongated array of directly interconnected backplane connector units, with the first connector unit thereof electronically engaged with the central processor, each of said backplane connector units comprising
   a. a single unitary structure formed in a substantially regular parallelepiped shape,
   b. a tongue portion
      1. extending outwardly from one side surface thereof, and
      2. incorporating a first set of contact means arrayed therein,
   c. a groove portion 1. formed in a second side surface of said backplane connector unit, parallel to the first side surface,
2. in direct receiving interengagement with said tongue portion, and
3. incorporating a second set of contact means arrayed therein which is in directly contacting, electronic interengagement with said first set of contact means, and
 d. module receiving contacts mounted to the front surface of said backplane connector unit in mating electronic engagement with the rear contact means of the module,
C. an elongated channel member incorporating
 a. a substantially flat rear surface supportingly mountable to a support,
 b. a substantially flat edge member
  1. peripherally surrounding the rear surface, and
  2. extending substantially perpendicularly from the rear surface, and
 c. two portal zones
  1. formed in opposed, facing portions of the edge member in juxtaposed facing relationship to each other, and
  2. dimensioned for supporting retention of a backplane connector unit mounted therein, while allowing electronic engagement of the backplane connector unit with adjacent backplane connector units whereby the plurality of electronic modules are quickly and easily directly, matingly electrically connected between said external devices and said central processor by merely being inserted and electrically connected to one of said plurality of backplane connector units, thereby providing a readily expandable, multi-purpose input/output system wherein complete electrical interconnection of the external equipment through the electronic module to the central processor is made quickly and easily, while also assuring system expandability by merely adding additional backplane connector units and associated electronic modules.

11. The input/output system defined in claim 10, further comprising
 D. a pair of module mounting tongues, each
  a. extending from securely mounted positions at opposed ends of the channel member, and
  b. incorporating locking means formed therein for mating, locking engagement with opposite surfaces of the module whereby the module is securely mounted to the channel member and held in position therewith.

12. The input/output system defined in claim 11, herein the module incorporates recesses on opposite end surfaces and locking means of the mounting tongues comprise projections adapted for nested locking engagement with the recesses of the module.

* * * * *